United States Patent
Hong

[19]

[11] Patent Number: 6,030,882
[45] Date of Patent: Feb. 29, 2000

[54] METHOD FOR MANUFACTURING SHALLOW TRENCH ISOLATION STRUCTURE

[75] Inventor: Gary Hong, Hsin-Chu, Taiwan

[73] Assignee: United Semiconductor Corp., Hsinchu, Taiwan

[21] Appl. No.: 09/223,200

[22] Filed: Dec. 30, 1998

[30] Foreign Application Priority Data

Nov. 6, 1998 [TW] Taiwan ................................. 87118500

[51] Int. Cl.⁷ .................................................. H01L 21/76
[52] U.S. Cl. ........................... 438/433; 438/437; 438/525
[58] Field of Search .................................... 438/424, 433, 438/437, 525

[56] References Cited

U.S. PATENT DOCUMENTS

H204    2/1987  Oh et al. .
4,523,369  6/1985  Nagakubo .............................. 29/576 W
4,534,824  8/1985  Chen .
4,824,797  4/1989  Goth .
5,436,189  7/1995  Reasom .
5,780,353  7/1998  Omid-Zohoor .......................... 438/433
5,841,170  11/1998  Adan et al. .............................. 257/345

*Primary Examiner*—Wael Fahmy
*Assistant Examiner*—Long Pham
*Attorney, Agent, or Firm*—J.C. Patents; Jiawei Huang

[57] ABSTRACT

A method for manufacturing shallow trench isolation structure in a substrate, in which by forming a doped region at the upper corners of a trench, the degree of oxidation in that region increases when the liner layer is formed over the exposed surface of the trench. Therefore, thickness of the liner layer at the upper corner regions of the trench is almost the same as in other regions. Consequently, a kink effect is prevented when a gate is subsequently formed over the active region of the substrate.

19 Claims, 4 Drawing Sheets

METHOD FOR MANUFACTURING SHALLOW TRENCH ISOLATION STRUCTURE

CROSS-REFERENCE TO RELATED APPLICATION

This application claims the priority benefit of Taiwan application serial no. 87118500, filed November 6, the full disclosure of which is incorporated herein by reference.

BACKGROUND OF THE INVENTION

1. Field of Invention

The present invention relates to a method for manufacturing a shallow trench isolation (STI) structure. More particularly, the present invention relates to a method for manufacturing an STI structure capable of forming a thicker liner oxide layer at the upper corner regions, thereby reducing the kink effect.

2. Description of Related Art

A device isolation region is a structure within the substrate for preventing the movement of carriers from one device to its neighbors. For example, device isolation regions are normally formed between metallic oxide semiconductor (MOS) transistors for reducing charge leakage. As the level of integration increases and line width of the device decreases to the sub-quarter micron (0.25 µm) range, STI is one of the principle means for isolating devices. An STI structure is formed by first performing an anisotropic etching operation to etch out a trench in a semiconductor substrate, and then refilling the trench with insulating material.

FIGS. 1A through 1F are schematic, cross-sectional views showing the progression of manufacturing steps according to a conventional method of forming a shallow trench isolation structure.

First, as shown in FIG. 1A, a pad oxide layer 102 is formed over a silicon substrate 100. The pad oxide layer 102 is removed before the gate oxide layer is formed. Thereafter, a silicon nitride ($Si_3N_4$) layer 104 is formed over the pad oxide layer 102 by performing a low-pressure chemical vapor deposition (LPCVD) operation.

Next, as shown in FIG. 1B, conventional method is used to form a patterned photoresist layer (not shown in the figure) over the silicon nitride layer 104. Then, using the patterned photoresist layer as a mask, the silicon nitride layer 104 is etched to form a silicon nitride layer 104a. Thereafter, using the silicon nitride layer 104a as a hard mask, the pad oxide layer 102 and the silicon substrate 100 are etched sequentially forming a pad oxide layer 102a and a trench 106 in the substrate 100. Hence, active regions 120 for laying the devices are patterned out. Finally, the photoresist layer is removed.

Next, as shown in FIG. 1C, a thermal oxidation method is used to form a liner layer 108 on the exposed surface inside the trench 106. The liner layer 108 extends all the way from the bottom of the trench 106 to the upper corner regions 130 and touch the pad oxide layer 102a. However, because the degree of oxidation at the upper corner regions 130 of the trench 106 is poor, thickness of the liner layer 108 in those regions 103 is thinner than the liner layer 108 in other places. In the subsequent step, silicon oxide material is deposited into the trench 106 by performing an atmospheric pressure chemical vapor deposition (APCVD) operation. The silicon oxide layer is then densified by heating to a high temperature, thereby forming an insulation layer 110.

Next, as shown in FIG. 1D, using the silicon nitride layer 104a as a polishing stop layer, a chemical-mechanical polishing (CMP) operation is carried out to remove a portion of the insulation layer 110. Finally, an insulation layer 110a is formed inside the trench 106.

Next, as shown in FIG. 1E, hot phosphoric acid ($H_3PO_4$) solution is used to remove the silicon nitride layer 104a, and then hydrofluoric acid (HF) solution is used to remove the pad oxide layer 102a. Finally, an insulation layer 110b, also known as an STI region, is formed inside the substrate 100.

The pad oxide layer 102a is removed using hydrofluoric acid solution in a wet etching operation. Since wet etching is an isotropic etching operation, the surface of the insulation layer 110a next to the junction with the substrate 100 can be over-etched by hydrofluoric acid. Therefore, recess cavities 138 are likely to form in the junction area between the substrate 100 and the surface of the insulation layer 110b. These recess cavities 138 expose a portion of the thin pad oxide layer 102a at the upper corner regions 130 of the trench 106.

Next, as shown in FIG. 1F, a gate oxide layer 112 is grown over the substrate 100. The gate oxide layer 112 makes contact with a portion of the liner layer 108. Subsequently, when a gate terminal 114 is formed over the gate oxide layer 112, a corner parasitic MOS transistor will form in the thin liner layer 108 at the upper corner region 130 of the trench 106. Therefore, reliability of the gate terminal 114 at the upper corner region 130 of the trench 106 will be lower. Furthermore, when the device is in operation, accumulated electric charges at the upper corner regions 130 of the trench 106 will also lead to an increase in the electric field. Hence, the threshold voltage will be increased leading to the generation of abnormal subthreshold current, also known as the kink effect. Therefore, the conventional method of forming the STI structure lowers device quality and yield.

In light of the foregoing, there is a need to improve the method of forming STI structure.

SUMMARY OF THE INVENTION

Accordingly, the purpose of the present invention is to provide a method for manufacturing a shallow trench isolation structure capable of forming a thicker liner layer at the upper corner regions of the trench. Consequently, no recess cavities are formed in a subsequent wet etching operation for removing the oxide layer, and hence a kink effect can be avoided and reliability of the device can be improved.

To achieve these and other advantages and in accordance with the purpose of the invention, as embodied and broadly described herein, the invention provides a method for manufacturing a shallow trench isolation structure. The method includes the steps of forming a mask layer having a trench pattern over a substrate. Then, ions are implanted at an tilt-angle into the non-active region of the substrate to form a doped region using the mask layer as a hard mask. Thereafter, a trench is formed in the substrate such that a portion of the doped region is removed. Hence, only a portion of the doped region remains at the upper corner regions of the trench. Subsequently, a thermal oxidation is carried out to form a liner layer. Since the regions at the upper corners of the trench are doped, the degree of oxidation there is enhanced. Therefore, the ultimate thickness of the liner layer at the upper corner regions of the trench will be similar to the thickness elsewhere.

According to one preferred embodiment of this invention, the dopants include N-type ions, preferably phosphorus or arsenic ions. Preferably, the ions are implanted at an tilt-angle between 7° and 30° with an energy level of between 10 and 50 KeV and a dosage of between $10^{13}$ and $10^{16}$ atoms/cm$^2$.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
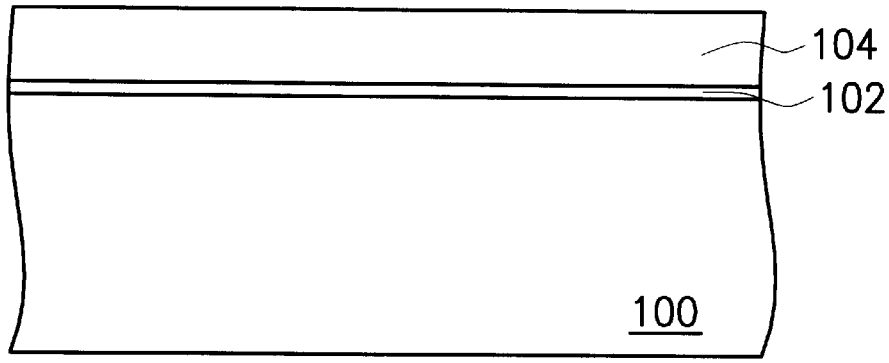
FIGS. 1A through 1F are schematic, cross-sectional views showing the progression of manufacturing steps according to a conventional method of forming a shallow trench isolation structure.
Figure 1B:
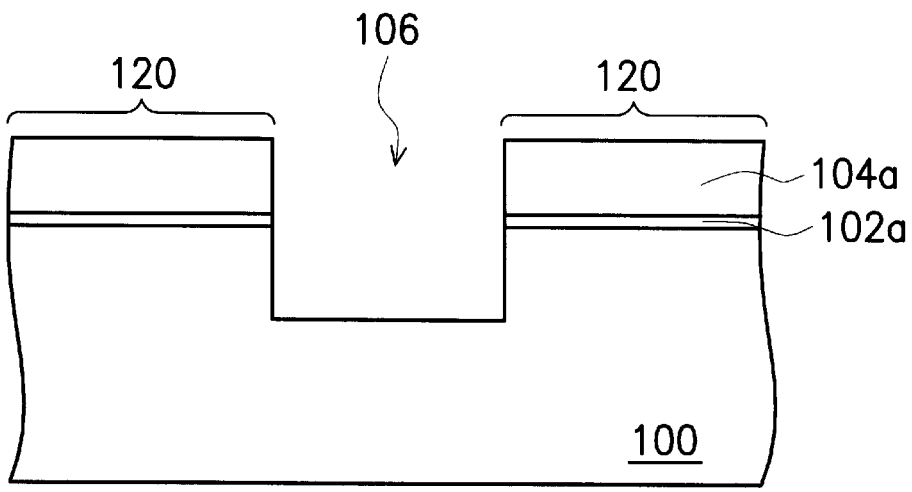
Figure 1C:
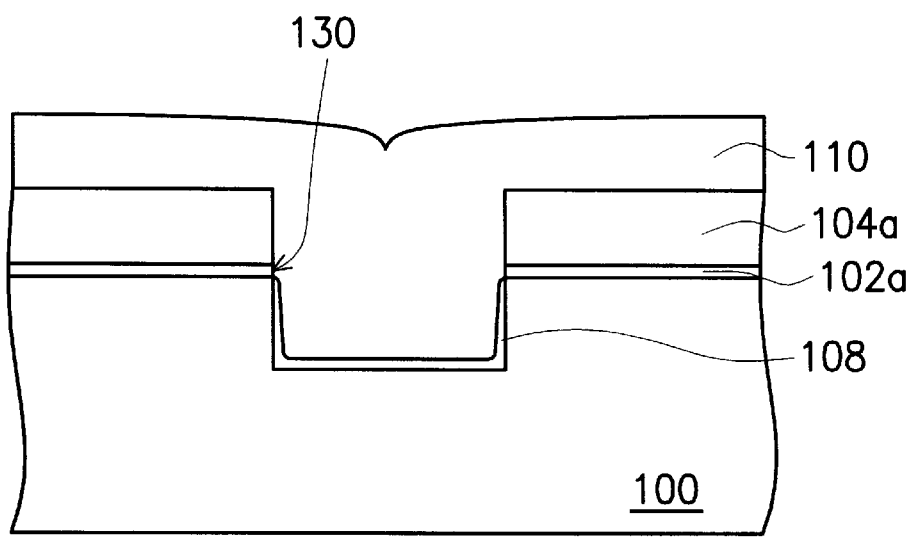
Figure 1D:
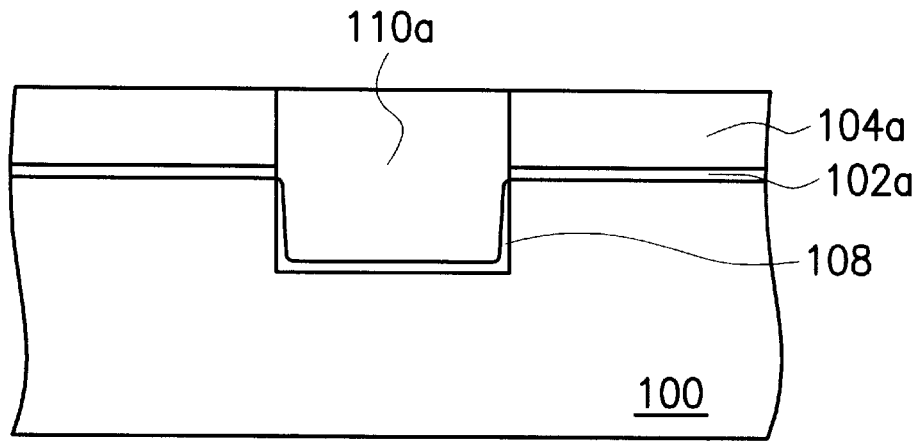
Figure 1E:
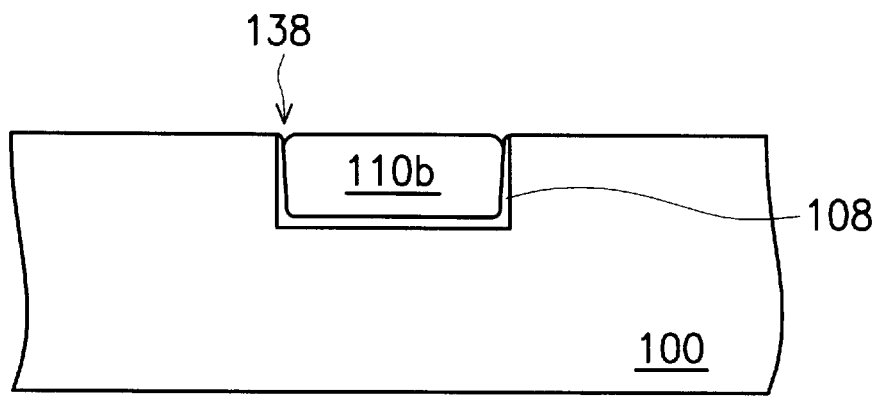
Figure 1F:
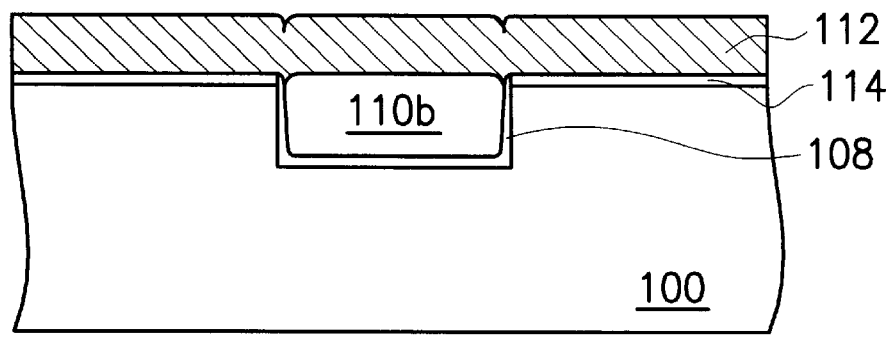

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2F are schematic, cross-sectional views showing the progression of manufacturing steps for forming a shallow trench isolation structure according to one preferred embodiment of this invention.

Figure 2A:
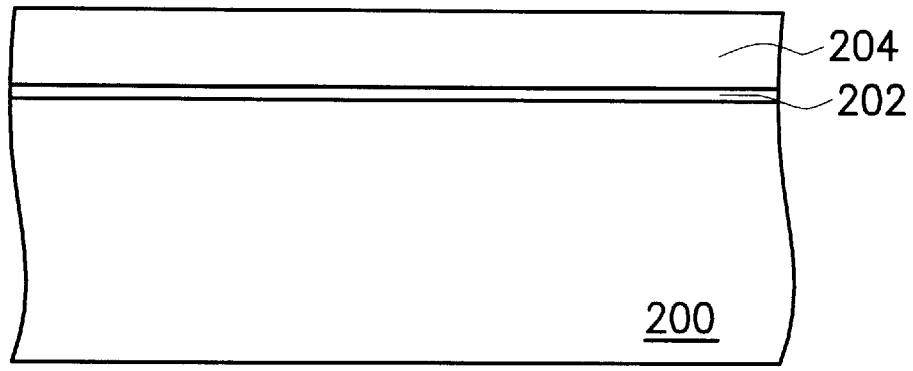
FIGS. 2A through 2F are schematic, cross-sectional views showing the progression of manufacturing steps for forming a shallow trench isolation structure according to one preferred embodiment of this invention.

First, as shown in FIG. 2A, a substrate 200, preferably a P-type silicon substrate, is provided. Then, a pad oxide layer 202 is formed over the substrate 200. The function of the pad oxide layer 202 is to protect the substrate 200 against unwanted damages during subsequent processing operations. The pad oxide layer 202 having a thickness of about 50 Å to 500 Å can be formed by performing thermal oxidation. Thereafter, a mask layer 204, preferably a silicon nitride layer, is formed over the pad oxide layer 202.

Figure 2B:
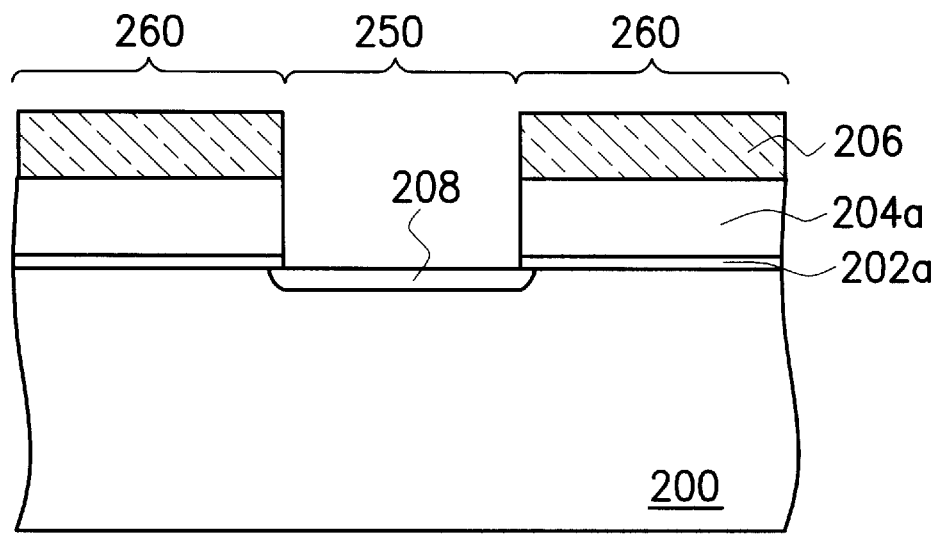
Figure 2C:
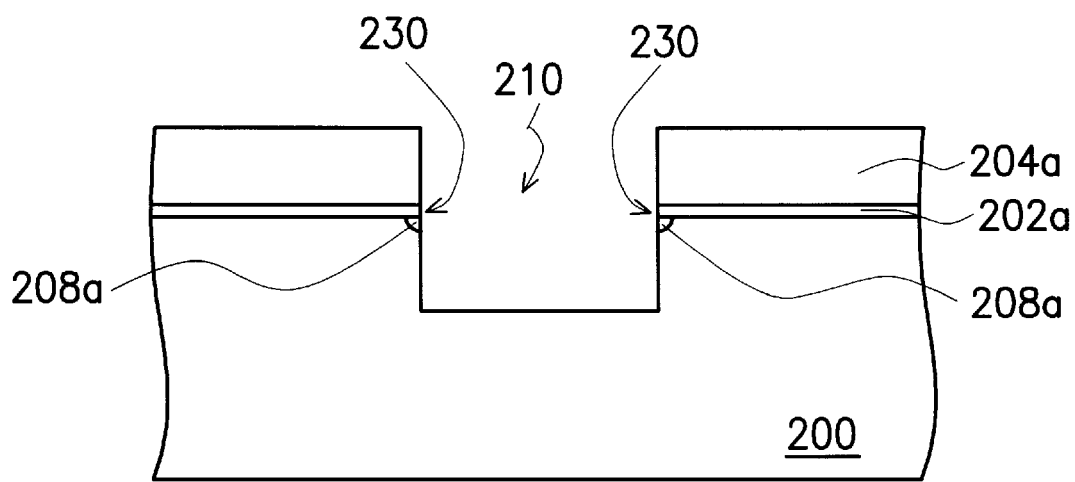

Next, as shown in FIG. 2B, a patterned photoresist layer 206 is formed over the mask layer 204, and then the mask layer 204 is etched to form a mask layer 204a. Then, using the mask layer 204a as a hard mask, the pad oxide layer 202 is etched to form a pad oxide layer 202a having a trench pattern. Hence, active regions 260 and non-active regions 250 are both defined. The non-active regions 250 are the locations for forming the trench isolation structures. Thereafter, using the photoresist layer 206 and the mask layer 204a as a hard mask, an ion implantation is conducted. In the ion implantation, N-type ions, preferably arsenic (As) or phosphorus (P) ions, are implanted into the substrate 200 in the non-active region 250 to form a doped region 208. The implantation can be carried out at a tilt-angle between 7° and 30° using an energy level of between 10 and 50 KeV and a dosage of between $10^{13}$ and $10^{16}$ atoms/cm$^2$. The doped region 208 extends a little into the substrate 200 region underneath the mask layer 204a. In other words, the doped region 208 is formed mainly in the non-active regions 250 of the substrate 200. However, a portion of the doped region 208 extends a little distance into the substrate 200 of the active regions 206.

Next, as shown in FIG. 2C, again using the photoresist layer 206 and the mask layer 204a as a hard mask, the substrate 200 is etched to form a trench 210. The trench 210 can be formed by performing an anisotropic dry etching operation. In general, depth of the trench 210 should be between 2000 Å and 5000 Å. During the etching operation, a portion of the material in the doped region 208 will be removed. Only a portion of the material in the doped regions 208 in the substrate 200 remains, just below the pad oxide layer 202a, thereby forming doped regions 208a. In other words, the doped regions 208a are located at the upper corners of the trench 210.

Figure 2D:
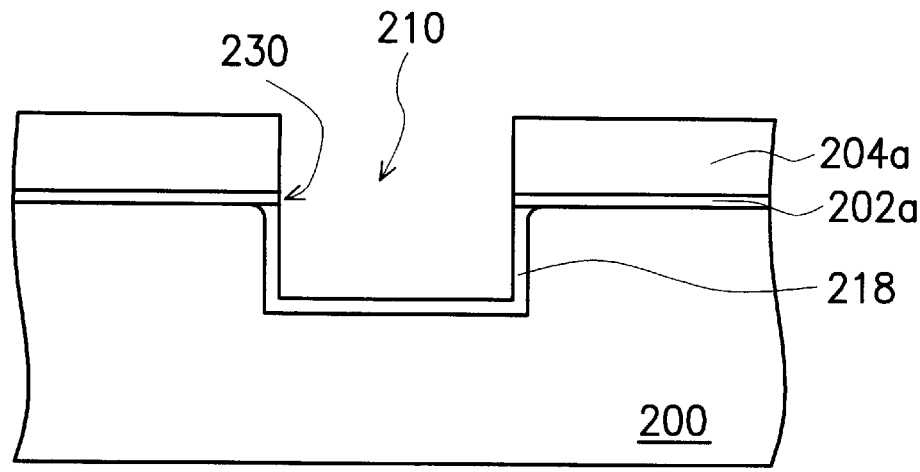

Next, as shown in FIG. 2D, a liner layer 218 having a thickness of between 100 Å and 600 Å is formed over the exposed substrate surface within the trench 210. The liner layer 218 extends from the bottom of the trench to the upper corner regions touching the pad oxide layer 202a. The liner layer 218 can be formed by performing a thermal oxidation at a temperature of about 900° C. in a nitrogen/oxygen ($N_2/O_2$) atmosphere. Alternatively, the thermal oxidation can be carried out at a lower temperature of about 800° C. in a nitrogen/hydrogen ($N_2/H_2$) atmosphere. Since the regions at the upper corners 230 of the trench 210 contain doped material, the degree of oxidation there is higher. Hence, a thicker liner layer 218 is formed around the upper corner regions 230 of the trench 210. In fact, the thickness of the liner layer 218 at the upper corner regions 230 is almost the same as in other areas.

Since the doped region 208a at the upper corners 230 of the trench 210 can facilitate the formation of a thicker liner layer 218, a kink effect caused by a thin liner layer in these regions can be avoided.

Figure 2E:
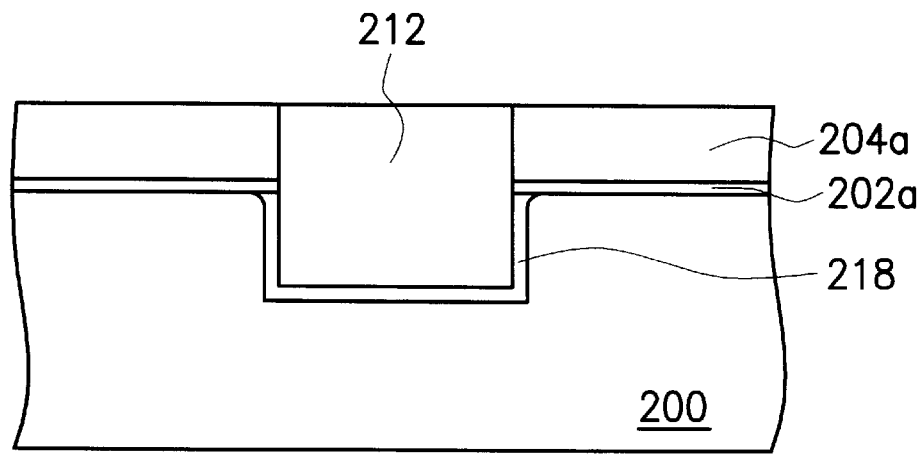

Next, as shown in FIG. 2E, an insulation layer is formed over the mask layer 204a. The insulation layer can be a silicon oxide layer formed by performing a chemical vapor deposition (CVD) operation. Thereafter, using the mask layer 204a as a polishing stop layer, a chemical-mechanical polishing (CMP) operation is carried out to polish the insulation into an insulation layer 212.

Figure 2F:
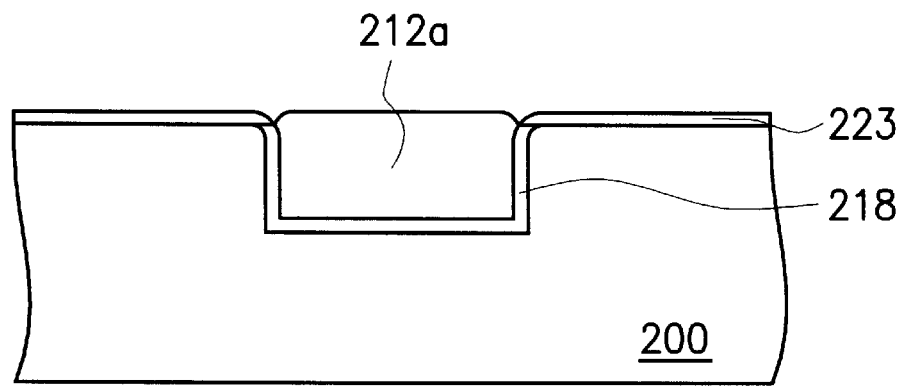

Next, as shown in FIG. 2F, the mask layer 204a is removed using hot phosphoric acid, for example. Thereafter, hydrofluoric acid solution is used to remove the pad oxide layer 202a. When the pad oxide layer 202a is etched, a portion of the insulation layer 212 is also removed. Hence, an insulation layer 212a is finally formed.

Subsequently, other processing operations necessary for forming a complete semiconductor structure are carried out. Since these operations are not directly related to the invention, detail description is omitted here.

In summary, one major characteristic of this invention is the doping of impurities at the upper corner regions of the trench so that a thicker liner layer can be formed. Hence, no recess cavities are formed in the corner regions when the exposed liner layer is etched. Consequently, a kink effect that results from forming a gate terminal over the active region can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for manufacturing a shallow isolation trench structure, comprising the steps of:

providing a first conductive type substrate and then forming a mask layer over the substrate such that a trench pattern appears on the mask layer;

implanting a second conductive type dopant into the substrate to form a doped region using the mask layer as a hard mask, wherein the first conductive type is different than the second conductive type;

transferring the trench pattern in the mask layer onto the substrate for forming a trench such that a portion of the doped region in the substrate is removed, and only a portion of the doped region at an upper corner region of the trench is retained;

forming a liner layer on an exposed surface of the trench by thermally oxidizing the exposed surface and the remaining portion of the doped region;

depositing an insulation material to fill the trench; and removing the mask layer to form a complete shallow trench isolation (STI) structure.

2. The method of claim 1, wherein the step of implanting dopants into the substrate to form the doped region includes implanting the dopants at a tilt-angle so that a liner layer with substantially uniform thickness is formed in the subsequent step of forming the liner layer.

3. The method of claim 2, wherein the dopants are implanted at a tilt-angle of between 7° and 30°.

4. The method of claim 1, wherein the step of forming the doped region includes implanting dopants into the substrate with an energy level of between 10–50 KeV.8 so that a liner layer with substantially uniform thickness is formed in the subsequent step of forming the liner layer.

5. The method of claim 1, wherein the step of forming the doped region includes implanting dopants into the substrate with dopants of about $10^{13}$–$10^{16}$ atoms/cm$^2$ so that a liner layer with substantially uniform thickness is formed in the subsequent step of forming the liner layer.

6. The method of claim 1, wherein the dopants include N-type ions when a P-type substrate is provided as the first conductive substrate.

7. The method of claims 6, wherein the dopants include phosphorus ions.

8. The method of claims 6, wherein the dopants include arsenic ions.

9. A method for manufacturing a shallow trench isolation (STI) structure that includes steps of forming a trench in a substrate using a patterned mask as a hard mask, then forming a liner layer over an exposed surface of the trench, and refilling the trench with an insulation material to form a complete STI structure, wherein the characteristics of the method includes:

using a pattern mask as a hard mask, implanting dopants into the substrate at a tilt angle to form a doped layer prior to the formation of the trench, wherein the doped layer extends under a portion of the patterned mask;

forming the trench such that a portion of the doped layer is removed while a portion of the doped layer extending under the patterned mask remains at an upper corner region of the trench; and performing a thermal oxidation to form the liner layer such that the degree of oxidation at the upper corner regions of the trench is increased due to the presence of the dopants, thereby forming the liner layer with a uniform thickness.

10. The method of claim 9, wherein the step of forming the doped region includes implanting dopants into the substrate at an tilt-angle of between 7° and 30°.

11. The method of claim 9, wherein the step of forming the doped region includes implanting dopants into the substrate with an energy level of between 10 and 50 KeV.

12. The method of claim 9, wherein the step of forming the doped region includes implanting dopants into the substrate with a dosage of about $10^{13}$ to $10^{16}$ atoms/cm$^2$.

13. The method of claim 9, wherein the dopants include N-type ions while a P-type substrate is provided.

14. The method of claims 13, wherein the dopants include phosphorus ions.

15. The method of claims 13, wherein the dopants include arsenic ions.

16. A method of manufacturing a shallow trench isolation structure, comprising:

providing a P-type substrate;

forming a mask layer on the P-type substrate, the mask layer having a trench pattern exposing a part of the substrate;

implanting an N-type dopant onto the exposed substrate with a dopant concentration, an implanting energy and a tilt angle such that a doped region is formed not only in the exposed substrate but also under a part of the mask layer;

removing a part of the exposed substrate including the doped region formed in the exposed substrate to form a trench;

thermally oxidizing an exposed surface of the trench including the doped region under that part of the mask layer;

filling the trench with an insulation material; and removing the mask layer; wherein the tilt angle, the dopant concentration and the implanting energy are controlled to enable the exposed surface of the trench to be thermally oxidized with a uniform thickness.

17. The method of claim 16, wherein the tilt angle is about 7–30 degree.

18. The method of claim 16, wherein the dopant concentration is about $10^{13}$–$10^{16}$ atoms/cm$^2$.

19. The method of claim 16, wherein the implanting energy is about 10–50 KeV.

* * * * *